United States Patent
Moriya et al.

(10) Patent No.: US 9,150,965 B2
(45) Date of Patent: Oct. 6, 2015

(54) PROCESSING APPARATUS

(75) Inventors: Shuji Moriya, Nirasaki (JP); Toyohiko Shindo, Sagamihara (JP); Noboru Tamura, Sagamihara (JP)

(73) Assignee: TOKYO ELECTRIC LIMITED, Tokyo (JP)

( * ) Notice: Subject to any disclaimer, the term of this patent is extended or adjusted under 35 U.S.C. 154(b) by 714 days.

(21) Appl. No.: 13/262,005

(22) PCT Filed: Mar. 30, 2010

(86) PCT No.: PCT/JP2010/055703
§ 371 (c)(1),
(2), (4) Date: Nov. 14, 2011

(87) PCT Pub. No.: WO2010/113946
PCT Pub. Date: Oct. 7, 2010

(65) Prior Publication Data
US 2012/0055402 A1 Mar. 8, 2012

(30) Foreign Application Priority Data

Mar. 31, 2009 (JP) ................................. 2009-088332

(51) Int. Cl.
*C23F 1/00* (2006.01)
*H01L 21/306* (2006.01)
(Continued)

(52) U.S. Cl.
CPC ........... *C23C 16/4402* (2013.01); *C23C 16/448* (2013.01); *C23C 16/4488* (2013.01); *C23C 16/452* (2013.01); *C23C 16/45561* (2013.01); *C23C 16/52* (2013.01)

(58) Field of Classification Search
CPC .. C23C 16/4488; C23C 16/452; C23C 16/52; C23C 16/45561; C23C 16/4402

USPC ............................... 118/715, 724; 156/345.37
See application file for complete search history.

(56) References Cited

U.S. PATENT DOCUMENTS 5,137,701 A * 8/1992 Mundt ........................... 423/210
5,160,544 A * 11/1992 Garg et al. .................... 118/724
(Continued)

FOREIGN PATENT DOCUMENTS

JP 63126229 A * 5/1988 .............. H01L 21/31
JP 4 277045 10/1992
(Continued)

OTHER PUBLICATIONS

Office Action issued May 6, 2013 in Chinese Patent Application No. 201080012229.7.
(Continued)

*Primary Examiner* — Rudy Zervigon
(74) *Attorney, Agent, or Firm* — Oblon, McClelland, Maier & Neustadt, L.L.P.

(57) ABSTRACT

A processing apparatus includes a gas supply passage for supplying a corrosive gas having a halogen, a part of the passage being made of a metal; a stabilization reaction unit which has an energy generator for supplying light energy or heat energy to the corrosive gas that has passed through the metallic part of the gas supply passage and/or has an obstacle configured to apply a collision energy to the corrosive gas that has passed through the metallic part of the gas supply passage, the collision energy being generated from a collision between the obstacle and said corrosive gas. A reaction for stabilizing a compound containing the metal and the halogen contained in the corrosive gas takes place by means of at least one of the light energy, heat energy, and collision energy; and a trapping unit which traps the compound stabilized in the stabilization reaction unit.

12 Claims, 9 Drawing Sheets

(51) Int. Cl.
*C23C 16/44* (2006.01)
*C23C 16/448* (2006.01)
*C23C 16/452* (2006.01)
*C23C 16/52* (2006.01)
*C23C 16/455* (2006.01)

(56) References Cited

U.S. PATENT DOCUMENTS

| | | | | |
|---|---|---|---|---|
| 5,174,881 | A | * | 12/1992 | Iwasaki et al. ............ 204/298.25 |
| 5,225,378 | A | * | 7/1993 | Ushikawa .................... 438/488 |
| 5,777,300 | A | * | 7/1998 | Homma et al. ............... 219/679 |
| 5,819,683 | A | * | 10/1998 | Ikeda et al. .................. 118/724 |
| 5,919,332 | A | * | 7/1999 | Koshiishi et al. ........ 156/345.47 |
| 6,086,679 | A | * | 7/2000 | Lee et al. ...................... 118/724 |
| 6,140,456 | A | * | 10/2000 | Lee et al. ....................... 528/196 |
| 6,143,081 | A | * | 11/2000 | Shinriki et al. ............... 118/719 |
| 6,149,729 | A | | 11/2000 | Iwata et al. |
| 6,171,684 | B1 | * | 1/2001 | Kahlbaugh et al. ........... 428/212 |
| 6,258,407 | B1 | * | 7/2001 | Lee et al. .................. 427/255.28 |
| 6,271,498 | B1 | * | 8/2001 | Miyake et al. ............. 219/121.43 |
| 6,315,963 | B1 | * | 11/2001 | Speer ......................... 422/186.3 |
| 6,316,055 | B1 | * | 11/2001 | Desu et al. ............... 427/255.28 |
| 6,516,143 | B2 | * | 2/2003 | Toya et al. .................... 392/480 |
| 6,534,616 | B2 | * | 3/2003 | Lee et al. ......................... 528/42 |
| 6,540,509 | B2 | * | 4/2003 | Asano et al. .................. 432/205 |
| 6,663,973 | B1 | * | 12/2003 | Lee et al. ...................... 428/447 |
| 6,863,732 | B2 | * | 3/2005 | Asano et al. .................. 118/715 |
| 6,884,295 | B2 | * | 4/2005 | Ishii et al. .................... 118/715 |
| 7,122,085 | B2 | * | 10/2006 | Shero et al. ................... 118/726 |
| 7,156,950 | B2 | * | 1/2007 | Kim et al. ................. 156/345.48 |
| 7,211,295 | B2 | * | 5/2007 | Takahashi et al. ........ 427/255.29 |
| 7,468,529 | B2 | | 12/2008 | Kawai et al. |
| 7,527,693 | B2 | * | 5/2009 | Derderian et al. ............ 118/719 |
| 7,892,357 | B2 | * | 2/2011 | Srivastava .................... 118/715 |
| 8,349,283 | B2 | * | 1/2013 | Hara et al. .................. 423/215.5 |
| 2001/0046792 | A1 | * | 11/2001 | Takahashi et al. ............ 438/786 |
| 2001/0049080 | A1 | * | 12/2001 | Asano et al. .................. 432/239 |
| 2003/0106495 | A1 | * | 6/2003 | Asano et al. .................. 118/724 |
| 2003/0188683 | A1 | * | 10/2003 | Lee et al. ...................... 118/50.1 |
| 2003/0196680 | A1 | * | 10/2003 | Lee et al. ....................... 134/1.1 |
| 2003/0198578 | A1 | * | 10/2003 | Lee et al. ...................... 422/138 |
| 2004/0007186 | A1 | | 1/2004 | Saito |
| 2004/0020598 | A1 | * | 2/2004 | Itatani et al. .............. 156/345.29 |
| 2004/0168769 | A1 | * | 9/2004 | Matsuoka et al. ........ 156/345.33 |
| 2004/0194707 | A1 | * | 10/2004 | Takahashi et al. ............ 118/722 |
| 2005/0047927 | A1 | * | 3/2005 | Lee et al. ...................... 417/152 |
| 2005/0072357 | A1 | * | 4/2005 | Shero et al. ................... 118/715 |
| 2006/0024517 | A1 | * | 2/2006 | Doan et al. ................... 428/469 |
| 2006/0276049 | A1 | * | 12/2006 | Bailey et al. .................. 438/758 |
| 2008/0020494 | A1 | * | 1/2008 | Ode ................................. 438/5 |
| 2008/0251018 | A1 | * | 10/2008 | Moriya et al. ................. 118/726 |
| 2009/0165715 | A1 | * | 7/2009 | Oh ............................. 118/723 R |
| 2009/0194233 | A1 | * | 8/2009 | Tamura et al. ............. 156/345.1 |
| 2011/0206585 | A1 | * | 8/2011 | Hara et al. .................. 423/215.5 |
| 2011/0237051 | A1 | * | 9/2011 | Hess et al. .................... 438/478 |
| 2012/0055402 | A1 | * | 3/2012 | Moriya et al. ................. 118/724 |
| 2012/0055403 | A1 | * | 3/2012 | Gomi et al. ................... 118/725 |
| 2012/0251716 | A1 | * | 10/2012 | Scott ............................. 427/184 |
| 2014/0004713 | A1 | * | 1/2014 | Igeta et al. .................... 438/775 |

FOREIGN PATENT DOCUMENTS

| | | |
|---|---|---|
| JP | 11 1773 | 1/1999 |
| JP | 2002 222807 | 8/2002 |
| KR | 10-2009-0031814 | 3/2009 |
| WO | 2004 006969 | 1/2004 |

OTHER PUBLICATIONS

International Search Report issued Jun. 29, 2010 in PCT/JP10/055703 filed Mar. 30, 2010.

* cited by examiner

PROCESSING APPARATUS

FIELD OF THE INVENTION

The present invention relates to a processing apparatus for processing an object to be processed.

BACKGROUND OF THE INVENTION

A semiconductor device manufacturing process includes a process for forming a film by, e.g., CVD (Chemical Vapor Deposition), by supplying a gas to a semiconductor wafer (hereinafter, referred to as a "wafer") or a process for etching the film on a surface of the wafer by a gas supplied to the wafer. A film forming apparatus or an etching apparatus for performing the above-described process includes a processing chamber for accommodating a wafer, a storage unit for storing a processing gas used for film formation or etching, and a storage unit for storing a cleaning gas for dry cleaning an interior of the processing chamber. The storage units for storing such gases and the processing chamber are connected through a gas supply device including gas supply lines, valves disposed in the gas supply lines, or the like.

In order to ensure a high corrosion resistance, the gas supply device is made of, e.g., stainless steel. Further, a filter for removing solid or liquid particles contained in gases may be disposed in the gas supply lines.

For the film forming apparatus or the etching apparatus, highly reactive halogen-containing gases referred to as an F (fluorine)-based gas, a Cl (chlorine)-based gas and a Br (bromine)-based gas respectively containing F, Cl and Br may be used. For example, the F-based gas may be used as a cleaning gas in the film forming apparatus. The Cl-based gas and the Br-based gas may be used as etching gases in the etching apparatus.

The halogen-containing gases react with stainless steel forming the gas supply device for supplying such gases, thereby generating a ternary compound containing halogen, metal and oxygen and a binary compound containing halogen and metal. These compounds cause metal contamination of the gas. A ternary compound and a binary compound, each having a high vapor pressure, flow in a gaseous state through the gas supply lines, and thus are supplied into the processing chamber without being trapped by the filter. The ternary compound and the binary compound are decomposed by exposure to an atmosphere in the processing chamber, so that metals contained in these compounds may be solidified and adhered to the wafer and the processing chamber. If so, the wafer is not normally processed, and the production yield may be decreased.

The gas supplied to the processing chamber is introduced into the gas exhaust line for exhausting the processing chamber. When the interior of the gas exhaust line becomes a low vacuum region where a gas pressure is high and the collisions between gas molecules are more dominant than the collisions between gas molecules and the pipe wall of the gas exhaust line, the flow velocity of the gas in the gas exhaust line is highest at the central axis of the gas exhaust line, and is decreased as it goes close to the pipe wall of the gas exhaust line from the central axis thereof, and becomes zero at the pipe wall. The gas may be diffused toward the upstream side, i.e., toward the processing chamber, along the pipe wall at which the flow velocity is zero. When the gas is diffused toward the processing chamber as described above, the ternary compound and the binary compound in the gaseous state are converted into compounds containing solid metals and then are adhered to the wafer or the processing chamber, which may lead to a decrease in the production yield. Further, a sub-device such as a vacuum gauge or the like may be attached to the processing chamber via an auxiliary passage. In a line forming the auxiliary passage as well as in the gas exhaust line, the gas may be diffused toward the processing chamber from the pipe wall at which the flow velocity is zero. Moreover, the gas may be diffused toward the processing chamber from the sub-device side due to changes in the pressure in the processing chamber. Even when the gas is diffused from the auxiliary passage, the ternary compound and the binary compound in the gaseous state may be converted into compounds containing solid metals and then adhered to the wafer or the processing chamber.

In order to prevent the decrease in the production yield caused by the above-described phenomenon, the following processes are carried out: the halogen-containing gas is supplied into the processing chamber; a dummy wafer (wafer that is not a product wafer) is transferred into the processing chamber and subjected to etching or film formation; the dummy wafer to which the metal is adhered is unloaded from the processing chamber; and a normal wafer is transferred into the processing chamber and subjected to etching or film formation. Or, the following processes may be carried out: a predetermined gas is supplied into the processing chamber; a film that covers the metal adhered to the wall surface of the processing chamber to prevent scattering of the metal is formed; and the wafer is transferred into the processing chamber and subjected to treatment. However, even when the dummy wafer is used or when the scattering prevention film is formed in the processing chamber, the processes which do not contribute to the fabrication of semiconductors are performed. Therefore, the throughput is decreased, and the processing cost is increased.

Japanese Patent Application Publication No. 2002-222807 discloses a technique for preventing metal contamination of a wafer by coating a metal member that contacts a gas with chromium oxide. However, the halogen-containing gas reacts with chromium oxide, so that the above-described problems cannot be solved.

SUMMARY OF THE INVENTION

In view of the above, the present invention provides a processing apparatus capable of preventing metal contamination of a processing chamber for processing an object to be processed and the object to be processed.

In accordance with one aspect of the present invention, there is provided a processing apparatus provided with a processing chamber for processing an object to be processed, the processing apparatus includes: a gas supply passage for supplying a corrosive gas including a halogen to the processing chamber, at least a part of the passage being made of a metal; a stabilization reaction unit which has an energy generator for supplying light energy or heat energy to the corrosive gas that has passed through the metallic part of the gas supply passage and/or has an obstacle configured to apply a collision energy to the corrosive gas that has passed through the metallic part of the gas supply passage, the collision energy being generated from a collision between the obstacle and said corrosive gas, and in which a reaction for stabilizing a compound containing the metal and the halogen contained in the corrosive gas takes place by means of at least one of the light energy, heat energy, and collision energy; and a trapping unit which traps the compound stabilized in the stabilization reaction unit.

Preferably, a portion of the gas supply passage to which at least one of the light energy, the heat energy and the collision energy may apply or a wall surface forming a downstream passage of the portion may have high corrosive resistance to the corrosive gas compared to a wall surface forming an upstream passage of the portion. In this case, a wall surface forming the passage of the portion or the wall surface forming the downstream passage of the portion may be made of any one of silicon, silica, diamond like carbon, alumina and fluorine resin.

In accordance with another aspect of the present invention, there is provided a processing apparatus including a processing chamber for processing an object to be processed by a corrosive gas containing halogen supplied thereinto, the processing apparatus includes a gas exhaust passage connected to the processing chamber, at least a part of the passage being made of a metal; a stabilization reaction unit which has an energy generator for supplying light energy or heat energy to the gas to be diffused from the metallic part of the gas exhaust passage toward the processing chamber and/or has an obstacle configured to apply a collision energy to the corrosive gas that is to be diffused from the metallic part of the gas exhaust passage toward the processing chamber, the collision energy being generated from a collision between the obstacle and said corrosive gas, and in which a reaction for stabilizing a compound containing the metal and the halogen contained in the gas in the gas exhaust passage takes place by means of at least one of the light energy, heat energy, and collision energy; and a trapping unit which traps the compound stabilized in the stabilization reaction unit.

In accordance with still another aspect of the present invention, there is provided a processing apparatus, including a processing chamber for processing an object to be processed by a corrosive gas containing halogen supplied thereinto, the processing apparatus includes an auxiliary passage connected to the processing chamber to allow a sub-device to be attached thereto, at least a part of the passage being made of a metal; a stabilization reaction unit which has an energy generator for supplying light energy or heat energy to the gas diffused from the metallic part of the auxiliary passage toward the processing chamber and/or has an obstacle configured to apply a collision energy to the corrosive gas that is to be diffused from the metallic part of the gas auxiliary passage toward the processing chamber, the collision energy being generated from a collision between the obstacle and said corrosive gas, and in which a reaction for stabilizing a compound containing the metal and the halogen contained in the gas in the auxiliary passage takes place by means of at least one of the light energy, heat energy, and collision energy; and a trapping unit which traps the compound stabilized in the stabilization reaction unit.

The obstacle of the stabilization reaction unit may include a filler made of a nonmetal filled in the passage. In this case, the filler may be used as the trapping unit. Further, the filler may be a group of ball-shaped bodies made of ceramic. In this case, the processing may further include at least one of a heating unit for heating the filler and a light irradiation device for irradiating light to the filler. Further, the filler may include a catalyst impregnated thereon.

In accordance with the present invention, the metal contamination of the processing chamber and the object to be processed can be prevented by the stabilization reaction unit and the trapping unit.

DETAILED DESCRIPTION OF THE EMBODIMENTS

Figure 1:
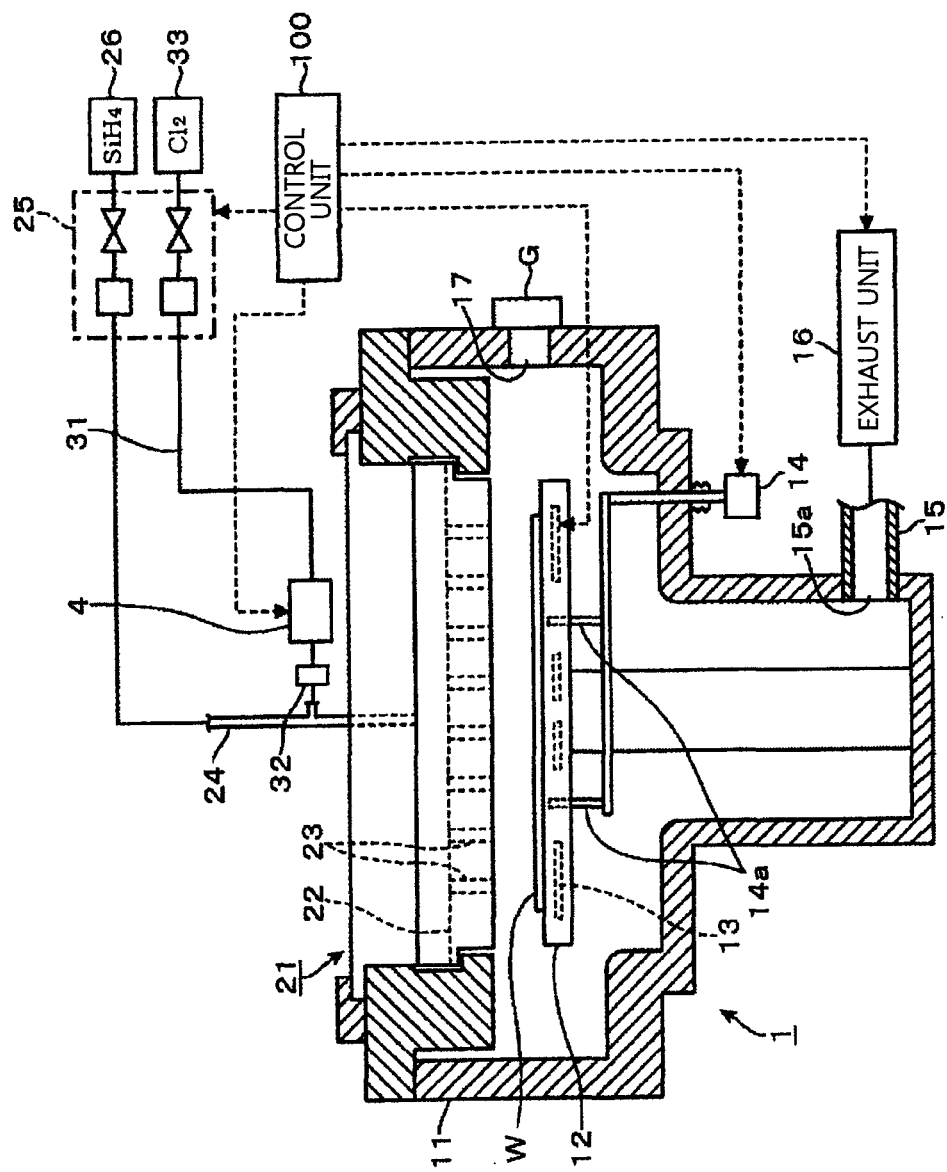
FIG. 1 is a longitudinal side view of a film forming apparatus as an example of a processing apparatus in accordance with the present invention.

A film forming apparatus 1 for forming a poly silicon (polycrystalline silicon) film on a wafer W by CVD will be described as an example of a processing apparatus with reference to FIG. 1 showing a longitudinal side view thereof. The film forming apparatus 1 includes a processing chamber 11 in which a mounting table 12 for horizontally mounting thereon the wafer W is provided. A heater 13 serving as a temperature control unit for the wafer W is provided in the mounting table 12. The mounting table 12 is provided with three elevation pins 14a (only two are shown for convenience) which can be raised and lowered by an elevation mechanism 14. The wafer W is transferred between the mounting table 12 and a transfer unit (not shown) via the elevation pins 14a.

A gas exhaust line 15 has one end connected to a gas exhaust port 15a provided at a bottom portion of the processing chamber 11 and the other end connected to a gas exhaust unit 16 including, e.g., a vacuum pump. The gas exhaust unit 16 includes a pressure control unit (not shown), and a gas exhaust amount is controlled in accordance with a control signal outputted from a control unit 100. Further, a transfer port 17 that is openable and closeable by a gate valve G is formed on a sidewall of the processing chamber 11.

A gas shower head 21 is provided at a ceiling portion of the processing chamber 11 so as to face the mounting table 12. The gas shower head 21 includes a partitioned gas chamber 22, and a gas supplied into the gas chamber 22 is supplied into the processing chamber 11 through a plurality of gas supply openings 23 disposed through the bottom side of the gas shower head 21.

A gas supply line 24 has one end connected to the gas chamber 22 and the other end connected to a gas supply source 26 for storing a $SiH_4$ (monosilane) gas serving as a source material of a poly silicon film via a flow rate control kit 25 having a valve or a mass flow controller. The flow rate control kit 25 controls a start and stop of supply of gas from each of the gas supply source 26 and a gas supply source to be described later to the wafer W in accordance with a control signal outputted from the control unit 100.

A gas supply line 31 has one end connected to the gas supply line 24 and the other end connected to a gas supply source 33 for storing a $Cl_2$ (chlorine) gas serving as a cleaning gas via a filter 32, an energy supply unit 4, and the flow rate control kit 25 in that order. The gas passage formed by the gas supply lines 24 and 31 and the flow rate control kit 25 is made of stainless steel. The filter 32 removes solid or liquid particles contained in the $Cl_2$ gas flowing through the gas supply line 31. The energy supply unit 4 will be described later.

The film forming apparatus 1 includes the control unit 100 for controlling operations of the heater 13, the gas exhaust unit 16, the flow rate control kit (25) and the like. The control unit 100 includes a computer having a CPU (not shown) and a program, wherein the program includes a group of steps (commands) for controlling operations for forming a film on the wafer W by the film forming apparatus 1, e.g., control of a temperature of the wafer W by the heater 13 or a pressure in the chamber 11, control of the amount of gases to be supplied into the processing chamber 11 and the like. This program is stored in a storage medium, e.g., a hard disk, a compact disc, a magnet optical disc, a memory card or the like, and is installed in the computer.

Figure 2A:
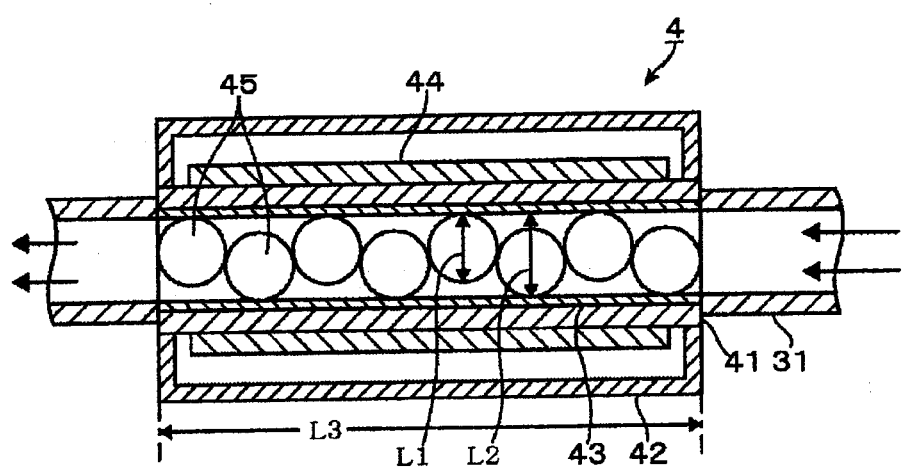
FIGS. 2A and 2B are configuration diagrams of an energy supply unit provided at the film forming apparatus.
Figure 2B:
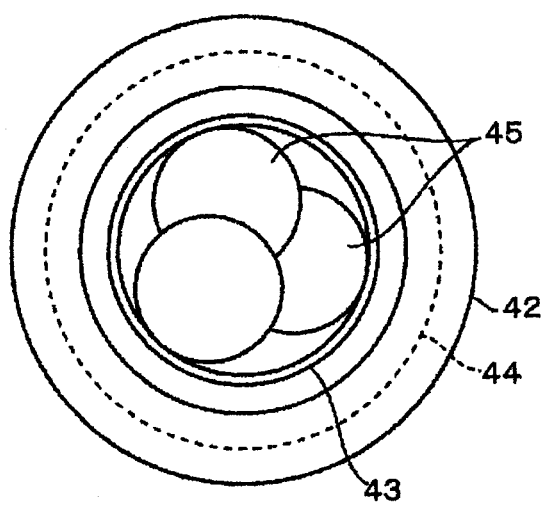

Hereinafter, the energy supply unit 4, i.e., the stabilization reaction unit, will be described with reference to FIGS. 2A and 2B. FIG. 2A shows a longitudinal cross section of the energy supply unit 4, and FIG. 2B shows the energy supply unit 4 seen from the opening direction thereof. The energy supply unit 4 includes an inner line 41 and an outer line 42 surrounding the inner line 41. The inner line 41 is connected to the gas supply line 31. The gas supplied to the energy supply unit 4 from the upstream side of the gas supply line 31 passes through the inner line 41 and then flows toward the downstream side of the gas supply line 31. The inner line 41 is made of, e.g., stainless steel, and an inner surface of the inner line 41 is coated with a silicon film 43.

A heater 44 surrounding the inner line 41 is provided at a space between the inner line 41 and the outer line 42, so that a gas passing through the inner line 41 can be heated to any temperature in accordance with a control signal outputted from the control unit 100. The inner line 41 is filled with a plurality of balls 45, each being a porous body. The balls 45 that are filling materials serve as obstacles which collide with the gas passing through the inner line 41. The collision energy generated from the collision applies to the gas, so that the compound including metal and halogen which is contained in the gas is stabilized. Further, the balls 45 serve as a trapping unit for trapping the stabilized compound. The balls 45 are made of alumina (aluminum oxide) as a ceramic material having a surface coated with silicon. In this example, each ball 45 has a diameter L1 of, e.g., about 3 mm. The inner line 41 has an inner diameter L2 of, e.g., about 4.35 mm and a length L3 of, e.g., about 300 mm.

The diameter L1 of the balls 45 is preferably about 50 to 87% of the inner diameter L2 of the inner line 41 in order to allow effective collision between the gas and the balls 45. It is preferable that the balls 45 are partially in contact with the silicon film 43 and are arranged such that they are not completely overlapped with each other in a gas flow direction (such that the central positions of the balls are misaligned).

The following is description of an operation of the film forming apparatus 1. Initially, the gate valve G opens, and the wafer W is transferred into the processing chamber by a transfer mechanism (not shown). The wafer W is mounted on the mounting table 12 via the elevation pins 14a, and the transfer mechanism is retreated from the processing chamber 11. Next, the gate valve G is closed, and the wafer W is heated to a predetermined temperature by the heater 13. The processing chamber 11 is exhausted to a predetermined pressure level and, then, a $SiH_4$ gas is supplied at a predetermined flow rate to the wafer W. The $SiH_4$ gas is decomposed by heat on the surface of the wafer W, and silicon is deposited on the surface of the wafer W. As a consequence, a poly silicon film is formed.

After a predetermined period of time elapses from the start of the supply of the $SiH_4$ gas, the supply of the $SiH_4$ gas is stopped, and the wafer W is unloaded from the film forming apparatus 1 by a transfer mechanism (not shown) in a reverse operation of the loading operation of the wafer into the film forming apparatus.

Hereinafter, changes in the line will be described with the schematic diagram of FIGS. 3A to 3D. After the wafer W is unloaded, temperature of the heater 44 of the energy supply unit 4 is raised to, e.g., about 150° C., and $Cl_2$ gas is supplied from the gas supply source 33 toward the downstream side of the gas supply line 31. At this time, the $Cl_2$ gas is set to be maintained at a room temperature that is a temperature of a clean room where the film forming apparatus 1 is installed. As can be seen from FIG. 3A, the $Cl_2$ gas reacts with Cr (chromium) and O (oxygen) contained in stainless steel forming the gas flow rate control kit 25 and the gas supply line 31 while passing through the passage formed by the flow rate control kit 25 and the gas supply line 31, thereby generating $CrO_2Cl_2$.

Figure 4:
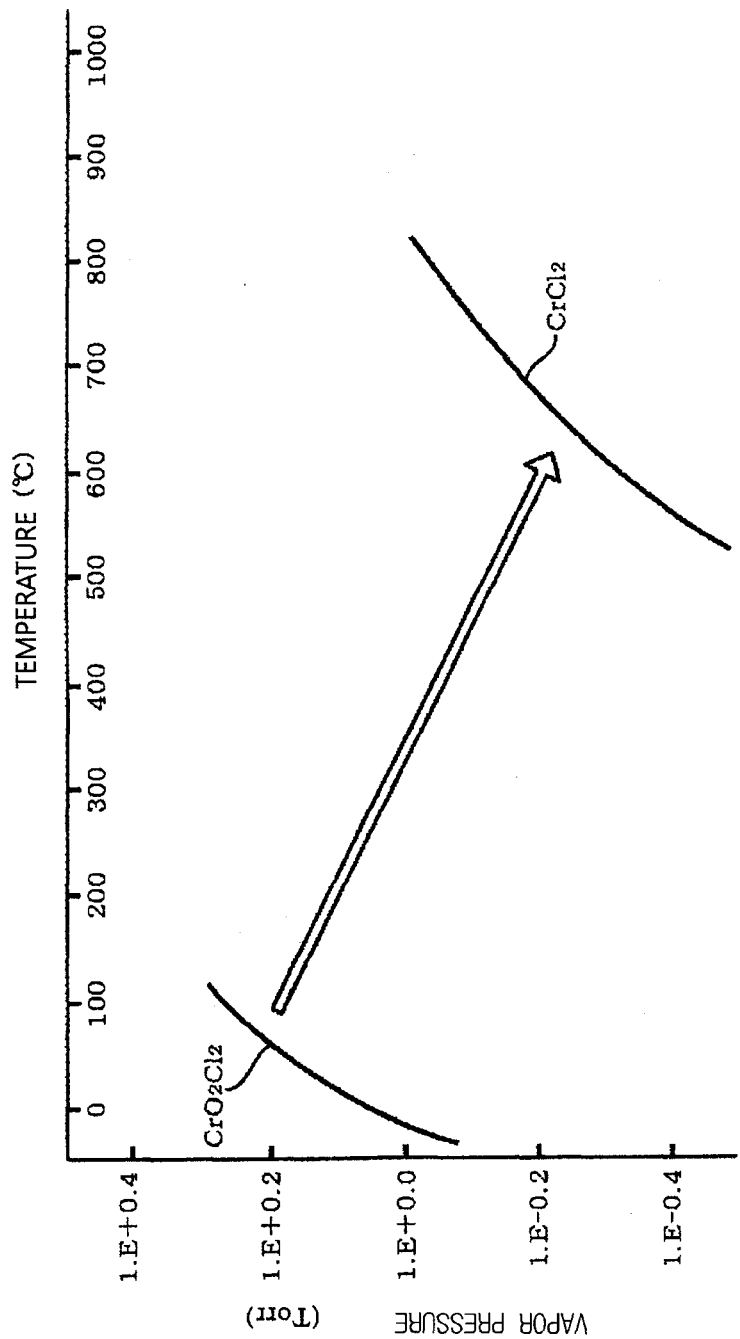
FIG. 4 is a graph showing a vapor pressure of a compound containing Cr.

FIG. 4 shows a vapor pressure curve of $CrO_2Cl_2$. As illustrated in FIG. 4, the vapor pressure of $CrO_2Cl_2$ is relatively high. The pressure in the gas supply line 31 is, e.g., in the range from about 0 kPa to about 300 kPa, and $CrO_2Cl_2$ is in a gaseous state under this pressure and at the temperature of the clean room. The generated $CrO_2Cl_2$ flows in a gaseous state toward the downstream side of the gas supply line 31 together with $Cl_2$ gas, and then is introduced into the energy supply unit 4.

Figure 3A:
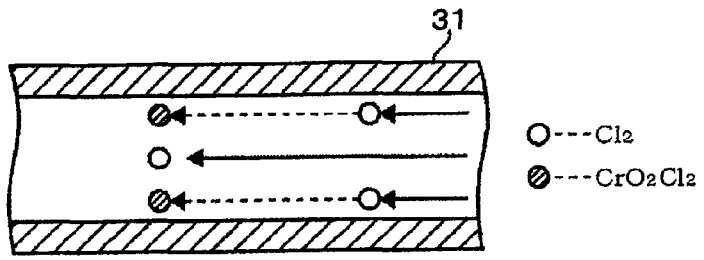
FIGS. 3A to 3D are flowcharts showing a Cr removal process in the film forming apparatus.
Figure 3B:
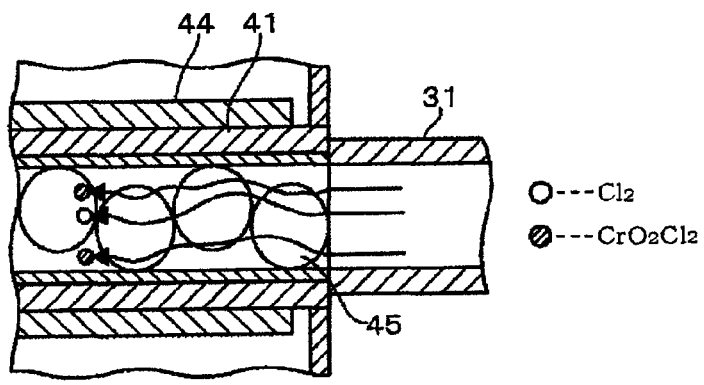
Figure 3C:
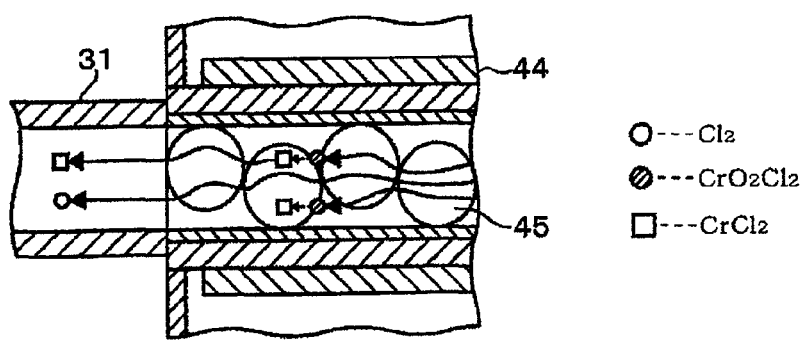

The $CrO_2Cl_2$ gas introduced into the energy supply unit 4 flows through the downstream side of the line 41 while colliding with the balls 45, as shown in FIG. 3B. The collision energy generated from such collision and the heat energy generated by the heater 44 are applied to the $CrO_2Cl_2$ gas, so that $CrO_2Cl_2$ is reduced to $CrCl_2$ that is more stable, as shown in FIG. 3C. As clearly can be seen from the vapor pressure curve of $CrCl_2$ in FIG. 4, the vapor pressure of $CrCl_2$ is lower than that of $CrO_2Cl_2$. Under the conditions of the temperature of the clean room and the pressure in the line, $CrCl_2$ obtained by reduction becomes solid particles in the passage of the inner line 41. Since the balls 45 are porous bodies as described above, the $CrCl_2$ particles are trapped in the balls 45 to thereby prevent the flow of the $CrCl_2$ particles toward the downstream side.

Figure 3D:
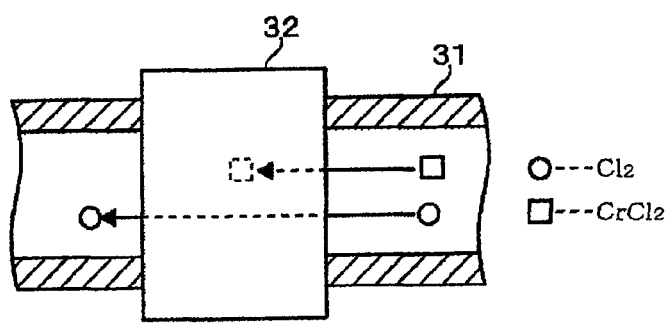

The $Cl_2$ gas containing the $CrCl_2$ particles which have passed through the group of balls 45 is introduced from the energy supply unit 4 into the filter 32 disposed at the downstream side. As shown in FIG. 3D, the particles are trapped by the filter 32 and removed from the $Cl_2$ gas. The $Cl_2$ gas is supplied into the processing chamber 11 and reacts with Si adhered to the wall surface of the processing chamber 11 or the mounting table 12. As a consequence, Si is removed. After a predetermined period of time elapses from the start of supply of the $Cl_2$ gas, the supply of the $Cl_2$ gas is stopped, and the temperature of the heater 44 is lowered.

In the above description, Cr and O contained in the material forming the gas supply line 31 react with $Cl_2$ gas, thereby generating $CrO_2Cl_2$. The generated $CrO_2Cl_2$ that is a ternary compound is reduced into $CrCl_2$, and $CrCl_2$ is removed. However, even when the reaction with $Cl_2$ leads to generation of an unstable metal compound having a high vapor pressure other than $CrO_2Cl_2$, it can be converted into a stable metal compound having a low vapor pressure and removed as in the case of $CrCl_2$. Although it is difficult to verify specific compound compositions and a conversion process thereof, there is such unstable metal compound having a high vapor pressure, e.g., one of binary compound containing halogen and metal. The circulation of a halogen-based gas in the line may lead to generation of this binary compound. By applying energy to this binary compound by the energy supply unit 4, this binary compound can be converted into a stable binary compound having a low vapor pressure and then removed as in the case of $CrCl_2$. At this time, the ratio of halogen and metal is different from the ratio thereof before the application of the energy. In addition, by applying energy on a ternary compound containing halogen, metal and oxygen as in the case of $CrO_2Cl_2$, the ternary compound can be converted into a solid binary compound containing metal and oxygen and having a lower vapor pressure and then removed as in the case of $CrCl_2$. As can be seen from the test to be described later, Fe as well as Cr is found to be removed by the energy supply unit 4.

As described above, in the film forming apparatus 1, the energy supply unit 4, i.e., the stabilization reaction unit, including the heater 44 for supplying heat energy to a gaseous state metal compound generated by reaction with $Cl_2$ and the balls 45 for applying collision energy to the metal compound by collision therewith, is provided in the gas supply line 31 where $Cl_2$ gas as a cleaning gas for cleaning the processing chamber 11 flows. The metal compound to which the energy is applied is stabilized and trapped in a solid state by the group of balls 45. This inhibits the supply of the metal compound to the processing chamber 11, and the metal contamination of the interior of the processing chamber 11 and the wafer W can be prevented. Further, it is not required to perform processes which do not contribute to the fabrication of semiconductor devices, such as a process for processing a dummy wafer loaded into the processing chamber 11 after supplying $Cl_2$ gas into the processing chamber 11, or a process for forming a film for preventing scattering of metal in the processing chamber before processing the wafer W. Hence, the throughput can be improved.

Further, a filter 32 for trapping and removing a solid metal compound from $Cl_2$ gas is provided at the downstream side of the energy supply unit 4. Therefore, the metal contamination of the interior of the processing chamber 11 and the wafer W can be reliably prevented.

In the above example, the inner surface of the inner line 41 is covered with the silicon film 43. However, an inner surface of a portion of the gas supply line 31 which is disposed at a downstream side of the energy supply unit 4 can also be covered with a silicon film. By allowing the energy supply unit 4 and the inner surface of the downstream line thereof to have high corrosion resistance to $Cl_2$ gas compared to the inner surface of the upstream line of the energy supply unit 4, it is possible to prevent corrosion of the components and metal contamination of the interior of the processing chamber 11 and the wafer W. The inner surface of the line may be made of, instead of silicon, e.g., silica, diamond like carbon, alumina, fluorine resin or the like.

Figure 5:
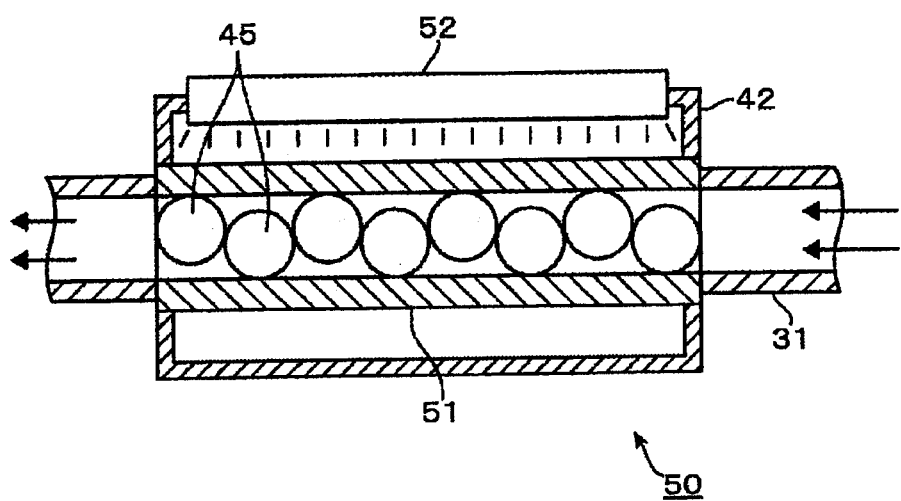
FIG. 5 is a cross sectional view showing another example of the energy supply unit.

Next, an example of the energy supply unit for supplying light energy instead of heat energy will be described. An energy supply unit 50 shown in FIG. 5 includes an inner line 51 instead of the inner line 41, and the inner line 51 is made of silicon so that it can transmit UV rays. In the energy supply unit 50, the outer line 42 is provided with a UV lamp 52, instead of the heater 44. When the $Cl_2$ gas is supplied to the processing chamber 11, UV rays are irradiated from the UV lamp 52 to the $Cl_2$ gas passing through the inner line 51. Due to the energy from the UV rays, the above described unstable compound having a high vapor pressure which is contained in the $Cl_2$ gas is converted into a stable compound having a low vapor pressure.

Figure 6A:
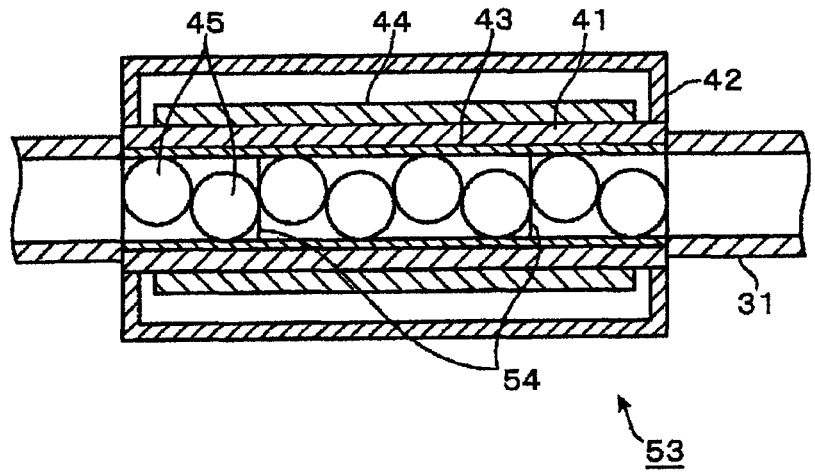
FIGS. 6A and 6C are cross sectional views showing still another example of the energy supply unit. Further.
Figure 6B:
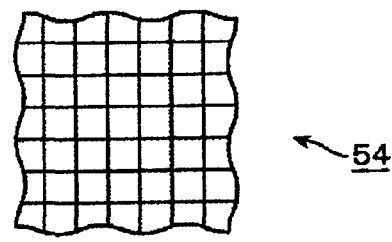
FIG. 6B illustrates the mesh-shaped member seen from the opening direction of the inner line.

FIG. 6A shows another example of the energy supply unit. The energy supply unit 53 carries a mesh-shaped member 54 made of, e.g., Pt (platinum) or Ni (nickel) between the balls 45. FIG. 6B illustrates the mesh-shaped member 54 seen from the opening direction of the inner line 41. The mesh-shaped member 54 serves as a catalyst that contacts a gas flowing in the line 41 and decreases activation energy required for converting a compound having a high vapor pressure which is contained in the gas into a compound having a low vapor pressure. Due to the heat energy from the heater 44 and the collision energy generated from the collision with the balls 45, the compound having reduced activation energy is converted into a stable compound. By using the energy supply unit 53, the above described conversion of the compound can be accomplished with a lower energy compared to that required in the case of using the energy supply unit 4. Hence, the metal contamination of the processing chamber 11 and the wafer W can be more reliably prevented.

Figure 6C:
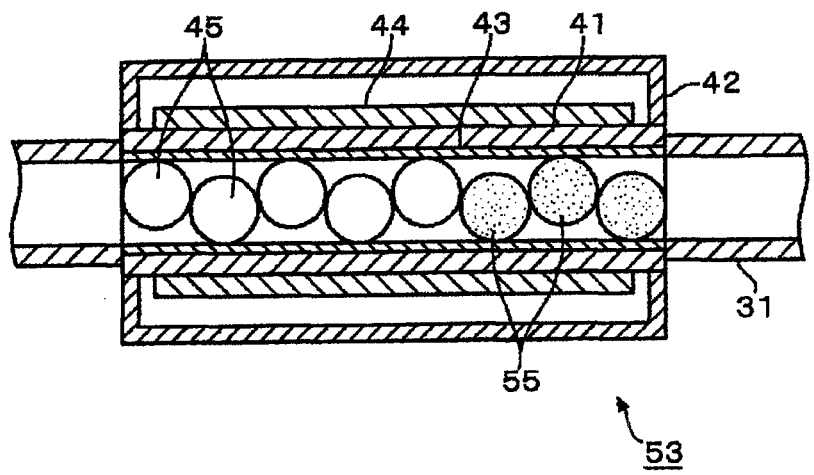

In case of using a catalyst, a ball-shaped catalyst may fill the inner line 41 instead of a mesh-shaped catalyst. FIG. 6C shows an example of providing balls 55 made of Pt. In FIG. 6C, the balls 55 are shaded by dots so that they can be distinguished from the balls 45.

Figure 7:
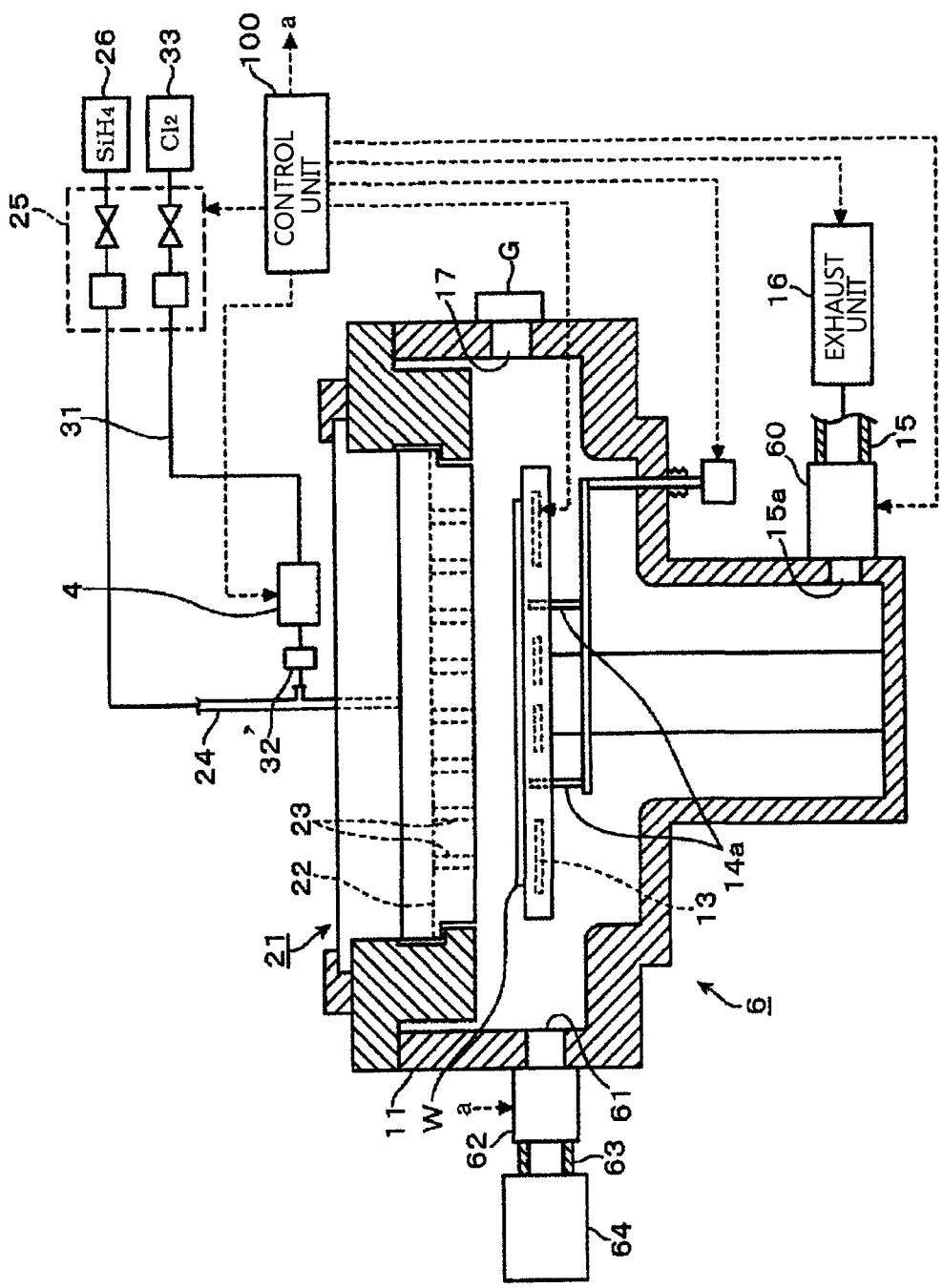
FIG. 7 is a longitudinal side view showing another example of the film forming apparatus.

FIG. 7 shows another embodiment of the film forming apparatus. Hereinafter, differences between the film forming apparatus 1 and the film forming apparatus 6 shown in FIG. 7 will be described. In the film forming apparatus 6, the gas exhaust line 15 is connected to the gas exhaust port 15a via an energy supply unit 60 having the same configuration as that of the energy supply unit 4, i.e., the stabilization reaction unit. Further, an opening 61 is formed on a sidewall of the processing chamber 11, and is connected to one end of the line 63 forming an auxiliary passage via the energy supply unit 62 having the same configuration as that of the energy supply unit 4, i.e., the stabilization reaction unit. The other end of the line 63 is connected to a pressure sensor 64 as a sub-device for measuring a vacuum level in the processing chamber 11. The gas exhaust line 15 and the line 63 are made of stainless steel as in the case of the line 31.

As described in the background of the invention, the gas may be diffused toward the upstream side, i.e., toward the processing chamber, along the pipe wall of the exhaust line 15 depending on the pressure of the gas exhaust line 15. When the gas is diffused in the above manner, the supply of the metal forming the gas exhaust line 15 into the processing chamber 11 can be prevented by installing an energy supply unit 60. In the line 63 as well as in the gas exhaust line 15, the gas may be diffused toward the processing chamber 11 along the pipe wall thereof, or may be diffused from the pressure sensor 64 side toward the processing chamber 11 due to changes in the pressure in the processing chamber 11 during the processing of the wafer W. However, if the gas is diffused in the above manner, the supply of the metal forming the line 63 into the processing chamber 11 can be prevented by installing an energy supply unit 62. In this film forming apparatus 6, the filter 32 may be provided at the processing chamber 11 side when seen from the energy supply units 62 and 60. Besides, the energy supply units 50 and 53 may be provided instead of the energy supply units 60 and 62.

Figure 8A:
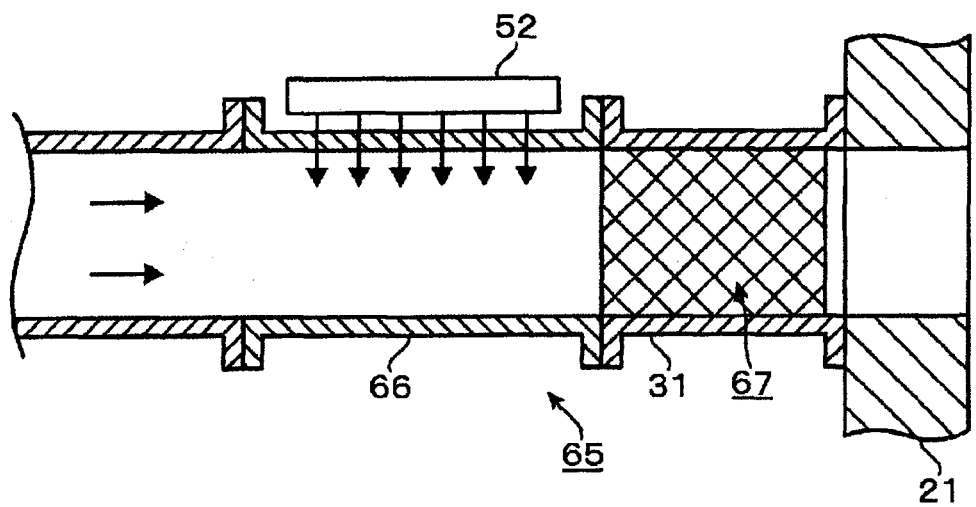
FIG. 8A is a cross sectional view showing still another example of the energy supply unit.

In each of the energy supply units, i.e., the stabilization reaction units, the supply of heat energy or light energy and the trapping the compound by the balls 45 are performed in the same place in the supply line of the halogen-contained gas. However, the energy supply and the compound trapping may be performed at different places. FIG. 8A shows an example thereof. The energy supply unit 65 shown in FIG. 8A includes a line 66 made of quartz, and the line 66 is disposed in the line 31. The UV lamp 52 supplies light energy to the gas passing through the passage of the line 66. A filter 67 made of a mesh-shaped glass fiber is provided in the line 31 disposed at the downstream side of the line 66 so as to trap the solid metal compound.

Figure 8B:
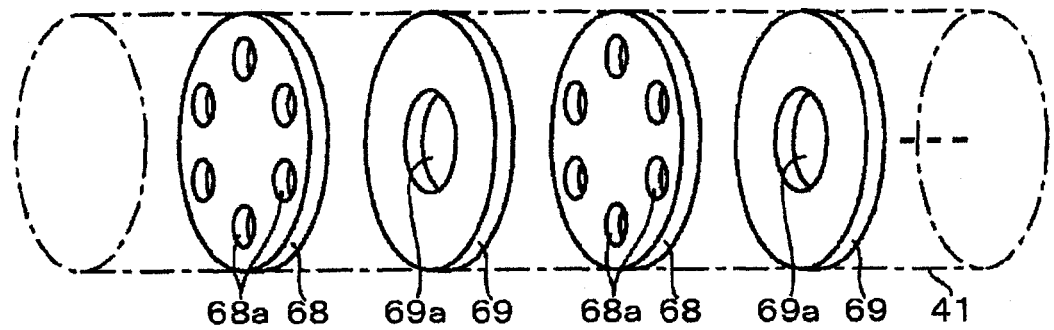
FIG. 8B is a perspective view showing control plates employed in the energy supply unit.

The obstacle for generating collision energy that applies to the gas is not limited to the balls 45. As shown in FIG. 8B, control plates 68 and 69 may be used to generate collision energy by their collisions with the gas. Through holes 68a and 69a are respectively formed in the control plates 68 and 69 which are disposed adjacent to each other such that the through holes 68a and 69a are not overlapped with each other in the gas flow direction.

In the above example, the film forming apparatus having the energy supply unit 4 is used as the semiconductor device manufacturing apparatus. However, the semiconductor device manufacturing apparatus may also be an etching apparatus, an epitaxial wafer manufacturing apparatus for epitaxially growing a single crystalline layer on a surface of a silicon wafer or the like by supplying a gas thereonto, an LED manufacturing apparatus or the like. The energy supply unit 4 may also be provided in these apparatuses. Further, the semiconductor device manufacturing apparatus described in the above includes an FPD (flat panel display) manufacturing apparatus, a solar cell manufacturing apparatus, and an organic EL manufacturing apparatus. The energy supply unit may also be provided in these apparatuses. The aforementioned various energy supply units, i.e., the stabilization reaction units, can also be applied to various processing apparatuses for processing an object to be processed by supplying a gas into the processing chamber, other than the semiconductor manufacturing apparatus.

Test Example

Test Example 1

Figure 9:
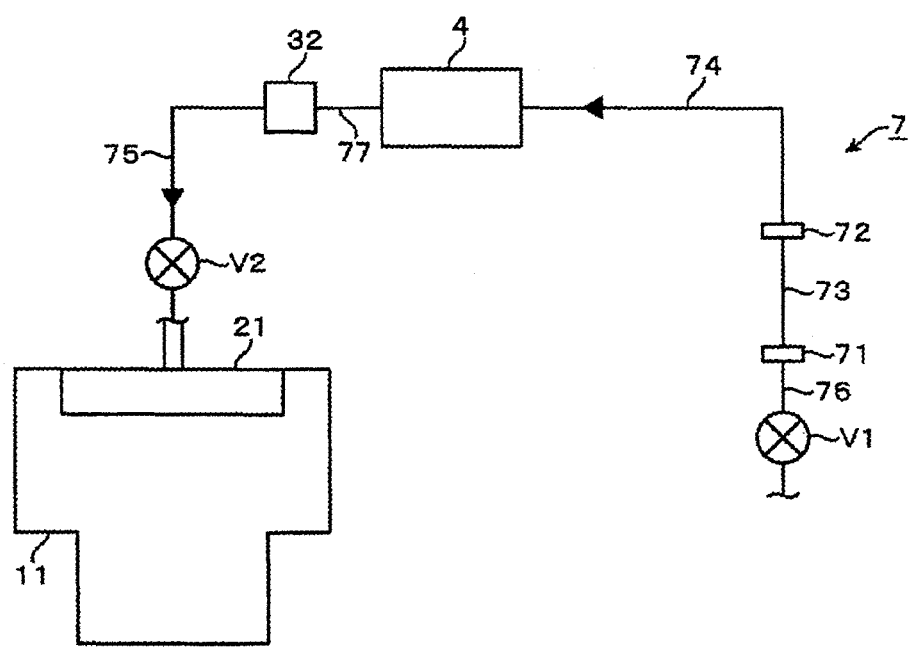
FIG. 9 is a schematic diagram of an apparatus used in a test for examining the effect of the energy supply unit.

A gas line system 7 shown in FIG. 9 was connected to the processing chamber 11. The line in which the filter 32 and the energy supply unit 4 were disposed was formed by connecting a flexible line and a hard line. Reference numerals 71 and 72 in the drawings indicate connection portions of the lines. As for a line 73 between the connection portions 71 and 72, there was used a new flexible line having an inner surface made of stainless steel that caused metal contamination. As for a line 74 between the connection portions 72 and the energy supply unit, there was used a new flexible line having an inner surface made of stainless steel. As for a line 75 between the filter 32 and the valve V2, there was used a flexible line having an inner surface made of silica coat. Lengths of the lines 73, 74 and 75 were about 30 cm, 30 cm, and 50 cm, respectively. The valve V1 and the connection portions 71, and the energy supply unit 4 and the filter 32 were connected by hard lines 76 and 77, respectively. The inner surface of the line 76 was made of stainless steel. The inner of the line 77 was made of silica coat. Each of the lines was set to have a diameter of about ¼ inch (6.35 mm). The inner surfaces of the lines 75 and 77 were made of silica coat in order to prevent corrosion at the downstream side of the energy supply unit 4 as described above. Here, silica was used although the above-described materials capable of inhibiting corrosion other than silica could be used.

After the line system 7 and the processing chamber 11 were connected, each of the lines was cleaned by purified water, and the heater 44 of the energy supply unit 4 was set to about 200° C. Thereafter, an $N_2$ gas cylinder was connected to the upstream side of the valve V1, and the $N_2$ gas was supplied into the processing chamber 11 via the line system 7 to purge (remove) the clean water. Then, the dry process was carried out.

Next, the test apparatus was formed by separating the cylinder from the valve V1 and then connecting thereto a gas supply system including an HBr gas supply source and an $N_2$ gas supply source. The indoor where the test apparatus was installed was set to a room temperature (22° C.). Due to this gas supply system, $N_2$ gas and HBr gas were able to be supplied into the processing chamber 11 via the line system 7. In this gas supply system, a mass flow controller for controlling a flow rate of HBr gas supplied into the processing chamber 11 was provided at the downstream side of the HBr gas supply source. Further, a plurality of $N_2$ gas supply sources could have been provided to supply $N_2$ gas into the processing chamber 11 at different flow rates.

In a state where the pressure of the processing chamber 11 was maintained at about 50 kPa, $N_2$ gas was supplied from the $N_2$ gas supply source at a flow rate of about 2.5 slm for about 50 minutes to purge contents of the processing chamber 11. Thereafter, in a state where the pressure of the processing chamber 11 was maintained at about 50 kPa, HBr gas was supplied from the HBr gas supply source into the processing chamber 11 at a flow rate of about 200 sccm for about 25 minutes. At this time, the power of the heater 44 of the energy supply unit 4 was turned off. Thereafter, the temperature of the heater 44 was set to about 100° C., and HBr gas was supplied into the processing chamber 11 at a flow rate of about 200 sccm for about five minutes. Then, the temperature of the heater 44 was set to about 150° C., and HBr gas was supplied into the processing chamber 11 at a flow rate of about 200 sccm for about five minute. Then, the temperature of the heater 44 was set to about 170° C., and HBr gas was supplied into the processing chamber 11 at a flow rate of about 200 sccm for about one hour. Next, HBr gas was supplied into the processing chamber 11 at a flow rate of about 200 sccm for about 25 minutes while turning off the power of the heater 44.

Next, the passage of the mass flow controller for supplying HBr gas was open for five minutes, and $N_2$ gas was supplied at a flow rate of about 500 cc for about 10 minutes into the passage of the mass flow controller to purge the passage thereof. Further, $N_2$ gas was supplied to the processing chamber 11 at a flow rate of about 2500 cc per minute for about 35 minutes. Then, $N_2$ gas was supplied into the processing chamber 11 at a flow rate of about 500 cc per minute overnight to purge the processing chamber 11.

Next, as described in the above embodiment, the wafer W (referred to as a "wafer W1" for convenience) was loaded into the processing chamber 11, and the processing chamber 11 was exhausted to vacuum (the vacuum evacuation performed after the loading of the wafer W is referred to as a "step A"). Then, $N_2$ gas was supplied from the $N_2$ gas supply source at a flow rate of about 500 cc per minute into the processing chamber 11. At this time, the power of the heater 44 was turned off, so that the heater 44 was maintained at the room temperature of about 22° C. In a state where the pressure in the processing chamber 11 was maintained at about 50 kPa, the gas supplied into the processing chamber 11 was gradually changed from $N_2$ gas to HBr gas for about 5 minutes. Then, HBr gas was supplied into the processing chamber 11 at a flow rate of about 100 sccm for one hour.

Thereafter, the supply of HBr gas was stopped. Then, $N_2$ gas was supplied at a flow rate of about 2500 cc per minute from the $N_2$ gas supply source while maintaining the pressure of the processing chamber 11 to about 50 kPa in order to purge the processing chamber 11. After the interior of the processing chamber 11 was changed from a vacuum atmosphere to an atmospheric atmosphere (referred to as a "step B"), the wafer W1 was unloaded from the processing chamber 11, and the amount of Fe and Cr adhered to the wafer W1 was measured by the ICP mass analysis.

Test Example 2

After the wafer W1 was unloaded from the processing chamber 11 in the test example 1, another wafer W (referred to as a "wafer W2" for convenience) was loaded during the supply of $N_2$ gas and then was subjected to the steps A and B of the test example 1. However, the temperature of the heater 44 was set to about 150° C. during the supply of HBr gas. After an atmosphere of the processing chamber 11 is converted in the step B, the wafer W2 was unloaded from the processing chamber 11, and the amount of Fe and Cu adhered to the wafer W2 was measured by the ICP mass analysis.

Test Example 3

The test was performed in the same sequence as that of the test example 1 by using the apparatus having the gas supply system and the gas line system 7 as in the test example 1. However, the filter 32 was not provided in the gas line system 7.

Hereinafter, differences from the test example 1 will be mainly described. After the apparatus was assembled, the interior of the processing chamber 11 was maintained at about 50 kPa while setting the temperature of the heater 44 to about 370° C. $N_2$ gas was supplied at a flow rate of about 500 cc per minute for 45 minutes from the $N_2$ gas supply source in order to purge the processing chamber 11. Then, the temperature of the heater 44 was set to about 300° C., and the interior of the processing chamber 11 was maintained at about 50 kPa. $N_2$ gas was supplied at a flow rate of about 500 cc per minute for 15 minutes from the $N_2$ gas supply source to purge the processing chamber 11. Thereafter, the wafer W (referred to as a "wafer W3" for convenience) was loaded into the processing chamber 11, and the interior of the processing chamber 11 was exhausted to vacuum. Next, the steps A and B were performed as in the test example 1. However, after supplying $N_2$ gas into the processing chamber 11 at a flow rate of about 500 per minute, the temperature of the heater 44 was set to be kept at about 300° C. until starting to supply HBr gas into the processing chamber 11. Then, the wafer W3 was unloaded from the processing chamber 11, and the amount of Fe and Cr adhered to the wafer W3 was measured by the ICP mass analysis. The heater 44 was cooled by turning off the power of the heater 44.

Test Example 4

After the wafer W3 was unloaded from the processing chamber 11 in the test example 3, another wafer W (referred to as a "wafer W4" for convenience) was loaded during the supply of $N_2$ gas and then was subjected to the steps A and B of the test example 1. However, the temperature of the heater 44 was set to about 35° C. during the supply of HBr gas. After an atmosphere of the processing chamber 11 was changed in the step B, the wafer W4 was unloaded from the processing chamber 11, and the amount of Fe and Cu adhered to the wafer W4 was measured by the ICP mass analysis.

Comparative Example 1

The test was performed in the same sequence as that of the test example 1. However, in the comparative example 1, the energy supply unit 4 was not provided in the gas line system 7.

TABLE 1

| | Filter | Heater temperature of energy supply unit | Cr detection value ($\times 1e^{10}$ atoms/cm$^2$) | Fe detection value ($\times 1e^{10}$ atoms/cm$^2$) |
|---|---|---|---|---|
| Test example 1 | ○ | 22° C. | Below detection limit | 0.38 |
| Test example 2 | ○ | 150° C. | Below detection limit | 0.38 |
| Test example 3 | X | 300° C. | 0.074 | 2.20 |
| Test example 4 | X | 35° C. | 0.22 | 0.82 |
| Comparative example 1 | ○ | X | 12 | 55 |

The table 1 shows results of the test examples and the comparative example. The Cu detection limit of the ICP mass spectrometer was about $0.074 \times 1e^{10}$ atoms/cm$^2$. In the test example 1, the Cu detection value was below the detection limit, and the Fe detection value was about $0.38 \times 1e^{10}$ atoms/cm$^2$. In the comparative example, the Cr detection measurement and the Fe detection measurement were about $12 \times 1e^{10}$ atoms/cm$^2$ and about $55 \times 1e^{10}$ atoms/cm$^2$, respectively. The detection measurements of Cr and Fe in the test example 1 are lower than those in the comparative example 1, so that the effect of the present invention has been proved. Further, this result shows that even if the heat energy of the heater 44 is not applied, the compound can be stabilized by the collision energy of the gas colliding with the balls and removed before it is supplied to the processing chamber 11. In other words, although the stabilization reaction units 6, 60, 62 and 65, each including an energy generator for supplying heat energy and light energy from outside, serve as energy supply units in the above description, the stabilization reaction unit for stabilizing a compound containing halogen and metal may not include an energy generator as long as an obstacle for generating collision energy is provided. The detection amounts of Cr and Fe in the test example 2 were smaller than those in the comparative example 1, thereby proving the effect of the present invention.

The detection amounts of Cr and Fe in the test example 3 were smaller than those in the comparative example 1. This shows that even if the filter 32 is not provided, the compound containing Cr and Fe can be trapped by the balls 45 of the energy supply unit 4, and the supply of the metal to the processing chamber 11 can be inhibited. As in the case of the test example 3, the detection amounts of Cr and Fe in the test example 4 were smaller than those in the comparative example 1. This also shows that the compound can be removed even if the filter 32 is not provided.

What is claimed is:
1. A processing apparatus comprising:
  a processing chamber for processing an object to be processed;
  a gas supply passage for supplying a corrosive gas including a halogen to the processing chamber, and comprising a metallic part made of a material including a metal;
  a stabilization reaction unit included with the gas supply passage;

a processor for control of said processing of the object, and configured to:
control supplying of the corrosive gas to the metallic part, wherein the control of said supplying of the corrosive gas generates a gas-state first compound containing the metal and the halogen,
control pressure in a region of the gas supply passage transporting the gas-state first compound to where the gas-state first compound is maintained in a vapor state, and
control at least one of supplying light energy or heat energy to the gas-state first compound that has passed through the metallic part of the gas supply passage wherein supplying light energy or heat energy 1) applies collision energy to the gas in the stabilization reaction unit, the collision energy being generated from a collision between an obstacle in the stabilization reaction unit and the gas-state first compound, and 2) converts the gas-state first compound into a solid-state halogenated second compound, which is more stable and has a lower vapor pressure than the gas-state first compound; and
a trap configured to trap the solid-state halogenated second compound.

2. The processing apparatus of claim 1, wherein a portion of the gas supply passage to which at least one of the light energy and the collision energy applies or a wall surface forming a downstream passage of the portion has high corrosive resistance to the corrosive gas compared to a wall surface forming an upstream passage of the portion.

3. The processing apparatus of claim 2, wherein a wall surface forming the passage of the portion or the wall surface forming the downstream passage of the portion is made of any one of silicon, silica, diamond like carbon, alumina and fluorine resin.

4. A processing apparatus comprising:
a processing chamber for processing an object to be processed by a corrosive gas containing halogen supplied thereinto,
a gas exhaust passage connected to the processing chamber, and comprising a metallic part made of a material including a metal;
a stabilization reaction unit included with the gas exhaust passage
a processor for control of said processing of the object, and configured to:
control supplying of the corrosive gas to the metallic part, wherein the control of said supplying of the corrosive gas generates a gas-state first compound containing the metal and the halogen,
control pressure in a region of the gas supply passage transporting the gas-state first compound to where the gas-state first compound is maintained in a vapor state, and
control at least one of supplying light energy or heat energy to the gas-state first compound that has passed through the metallic part of the gas supply passage wherein supplying light energy or heat energy 1) applies collision energy to the gas in the stabilization reaction unit, the collision energy being generated from a collision between an obstacle in the stabilization reaction unit and the gas-state first compound, and 2) converts the gas-state first compound into a solid-state halogenated second compound, which is more stable and has a lower vapor pressure than the gas-state first compound; and
a trap configured to trap the solid-state halogenated second compound.

5. A processing apparatus comprising:
a processing chamber for processing an object to be processed by a corrosive gas containing halogen supplied thereinto,
an auxiliary passage connected to the processing chamber to allow a sub-device to be attached thereto, and comprising a metallic part made of a material including a metal;
a stabilization reaction unit included with the auxiliary passage
a processor for control of said processing of the object, and configured to:
control supplying of the corrosive gas to the metallic part, wherein the control of said supplying of the corrosive gas generates a gas-state first compound containing the metal and the halogen,
control pressure in a region of the gas supply passage transporting the gas-state first compound to where the gas-state first compound is maintained in a vapor state, and
control at least one of supplying light energy or heat energy to the gas-state first compound that has passed through the metallic part of the gas supply passage wherein supplying light energy or heat energy 1) applies collision energy to the gas in the stabilization reaction unit, the collision energy being generated from a collision between an obstacle in the stabilization reaction unit and the gas-state first compound, and 2) converts the gas-state first compound into a solid-state halogenated second compound, which is more stable and has a lower vapor pressure than the gas-state first compound; and
a trap configured to trap the solid-state halogenated second compound.

6. The processing apparatus of any one of claims 1 to 4, wherein the obstacle of the stabilization reaction unit includes a filler made of a nonmetal filled in the passage.

7. The processing apparatus of claim 6, wherein the filler is configured to trap the solid-state halogenated second compound.

8. The processing apparatus of claim 6, wherein the filler is a group of ball-shaped bodies made of ceramic.

9. The processing apparatus of claim 6, wherein the filler includes a catalyst impregnated thereon.

10. The processing apparatus of claim 1, wherein the filter trap is made of a mesh-shaped glass fiber.

11. The processing apparatus of claim 4, wherein the filter trap is made of a mesh-shaped glass fiber.

12. The processing apparatus of claim 5, wherein the filter trap is made of a mesh-shaped glass fiber.

* * * * *